United States Patent [19]

Norman et al.

[11] Patent Number: 5,239,213
[45] Date of Patent: Aug. 24, 1993

[54] PRECISION TIMING CONTROL PROGRAMMABLE LOGIC DEVICE

[75] Inventors: Robert D. Norman, San Jose; Sai-Keung Lee, Milpitas; Om Agrawal, San Jose, all of Calif.

[73] Assignee: Advanced Micro Devices, Inc., Sunnyvale, Calif.

[21] Appl. No.: 897,575

[22] Filed: Jun. 11, 1992

Related U.S. Application Data

[63] Continuation of Ser. No. 787,769, Nov. 6, 1991, abandoned, which is a continuation of Ser. No. 516,752, Apr. 30, 1990, abandoned.

[51] Int. Cl.[5] ............................................. H03K 5/06
[52] U.S. Cl. ................................... 307/465; 307/480; 307/443; 307/603; 307/606; 307/590
[58] Field of Search .............. 307/465, 480, 591, 592, 307/593, 597, 443, 603, 606

[56] References Cited

U.S. PATENT DOCUMENTS

| | | | |
|---|---|---|---|
| 4,494,021 | 1/1985 | Bell et al. | 307/591 |
| 4,513,427 | 4/1985 | Borriello et al. | 375/110 |
| 4,623,805 | 11/1986 | Flora et al. | 307/591 |
| 4,745,310 | 5/1988 | Swapp | 307/597 |
| 4,845,390 | 7/1989 | Chan | 307/591 |
| 4,967,110 | 10/1990 | Matsuura | 307/465 |
| 4,975,605 | 12/1990 | Bazes | 307/606 |
| 4,994,695 | 1/1991 | Bazes | 307/603 |

Primary Examiner—William L. Sikes
Assistant Examiner—Scott A. Ouellette
Attorney, Agent, or Firm—Fliesler, Dubb, Meyer & Lovejoy

[57] ABSTRACT

A programmable logic device is disclosed having a delay line macrocell with programmably selectable taps feeding inputs to a programmable logic circuit. The delay line taps may feed the programmable logic circuit through logic circuit driving circuitry, which performs a certain amount of prepossessing on the tap signals before being provided to the programmable logic circuit. Outputs of the programmable logic circuit, which may be a programmable AND array followed by a fixed OR array, are provided to the edge-triggered inputs of dual set/reset flip flops. Other outputs of the programmable logic circuit are selectable as inputs to the delay line.

55 Claims, 6 Drawing Sheets

PRECISION TIMING CONTROL PROGRAMMABLE LOGIC DEVICE

This application is a continuation of Ser. No. 07/787,769 filed Nov. 6, 1991, now abandoned, which is a continuation of Ser. No. 07/516,752, filed Apr. 30, 1990, now abandoned.

DESCRIPTION OF RELATED APPLICATION

The present application is related to U.S. patent application Ser. No. 07/422,321, filed Oct. 16, 1989, in the name of Kuo-Su Chen, entitled "Temperature Self-Compensated Time Delay Circuits," and assigned to the assignee of the present application. The related application is incorporated herein by reference.

BACKGROUND OF THE INVENTION

1. Field of the Invention

The invention relates to a combination of programmable logic devices and delay lines.

2. Description of Related Art

There are two basic approaches to digital electronic circuit design, synchronous and asynchronous. The synchronous approach involves clocking registers and other elements once every fixed time period, whereas in the asynchronous approach there is either no clock or many clocks operating at different times. Synchronous circuits are reliable and easy to design, since the timing is always fixed, but some speed is sacrificed since the clock period must be set for the slowest component in the system. In the asynchronous approach, the user can apply successive signals to each component in the system with whatever minimum timing is specified for each respective component. For example, in a typical DRAM controller design, a signal is first applied to a multiplexer to select a row address to be applied to the DRAM. Once the row address stabilizes, the /RAS signal can be applied to the DRAM. A signal is then applied to the multiplexer to cause it to select the column address, and when that stabilizes, the /CAS signal is applied to the DRAM. At a certain period of time thereafter, the data output of the DRAM stabilizes and may be clocked into a data register. In a fully synchronous design, the entire DRAM read process may require several clock cycles to complete, whereas in an asynchronous design, control signals can be applied to the respective components with much tighter timing, thereby improving effective DRAM access speed markedly.

Precision timing control is often achieved in asynchronous designs by using a tapped delay line to generate arbitrarily spaced timing signals. A delay line is an electrical component which provides a predetermined time delay from signal input to signal output. Passive delay lines are usually constructed of simple LC networks with no active components, whereas as active delay lines include active drivers to improve reliability, square up the timing signal, and reduce signal attenuation. A tapped delay line is a delay line which has several taps, each providing a signal at successively increasing time periods from the time that the signal is initially applied to the delay line input. Examples of tapped delay lines are the DS100, DS1005, DS1007 and DS1010 series of silicon delay lines manufactured by Dallas Semiconductor.

One problem with prior-art delay lines is that they are typically fixed upon manufacture and not adjustable by the user. Users who require delays other than those available on standard parts therefore must either have custom delay lines manufactured or be satisfied with non-optimum delays. Dallas Semiconductor will set the delay times of its DS1007 according to a customer's specifications, but this setting must be done at the factory. The inability of users to change the delays in the field can slow design cycles and generate wasted devices if the user's needs change. Users also need to purchase a variety of different delay lines to cover all applications, which increases inventory and production costs. Devices are available which include a fixed tapped delay line, with a user-addressed multiplexer to select which delay tap is to be gated out. This method offers more flexibility, but is pin-intensive and still requires a large number of devices to obtain a plurality of different delayed signals. User-adjustable VCO-based analog delay generators also exist, but they are much more complicated and more costly than a string of delay elements.

Another problem with prior-art delay lines is that they must be coupled with external logic in order to create desired signals. External logic wastes board space, adds to an already large power requirement, and can easily cause undesirable skews. Skews are undesirable since the user, designing for worst-case speed parameters, usually must add a 20-30% margin on speed designations to accommodate skews.

Yet a third problem is that existing tapped delay lines are limited by either resolution or total delay. With fine resolution and a limited number of output pins, only a limited number of taps can be placed and the total delay will be small. On the other hand, if the total delay is long, then the resolution may be too coarse. Several delay line devices are therefore usually required if long delays with fine resolution are desired. Multiple delay lines can be costly, can add skew, can add to board space and power consumption problems, and may cause monotonicity problems.

SUMMARY OF THE INVENTION

The present invention is directed to overcoming the above problems and others. Roughly stated, one aspect of the invention involves a tapped delay line feeding a programmable logic array on a single chip, with edge-triggered flip flops in the output circuitry. The flip flops preferably comprise multiple-set, multiple-reset, edge-triggered set/reset flip flops, each of the inputs of which are connected to a respective array output. Preferably, the flip flops have two set and two reset inputs each. Having edge-triggered outputs makes the output signals independent of the width of pulses propagating down the delay lines. Having them as set/reset flip flops permits easy implementation of assert/negate logic, and including multiple-set and multiple-reset inputs makes it unnecessary to ensure that one set (reset) condition is turned off before the next occurs.

In another aspect of the invention, a tapped delay feeds a programmable logic array, an output of which can feed the input of the delay line. The trigger input of the delay line can derive either from the output of the array or from an external source, or be selectable between those sources. Providing the ability to drive the delay line trigger from an array output both permits economical and low-skew logic for the trigger signal, and also permits recirculating delay signals. A reinoculating delay signal can be used to generate very long delays without loss of resolution.

The programmable array is preferably a programmable combinatorial array, and preferably a programmable AND array followed by a fixed OR array. This permits programming of nearly any desired logic function or functions as a result of the timing signals from selected taps of the delay line and/or from external input signals to the array, all with minimal skew.

The delay line may have a large number of finely spaced taps, and may be included in a delay line macrocell which has a certain number of outputs feeding the array. The delay line macrocell has fewer outputs than there are taps in the delay line. A programmable connection array may then be provided to connect any one of the delay line macrocell outputs to any desired tap of the delay line. A second delay line may also be included in the delay line macrocell, the taps of which may provide additional inputs to the connection array. Cascading logic may be included in a delay line macrocell for cascading the two delay lines together or, selectably, applying a separate input signal to the trigger of the second delay line. Like the trigger to the first delay line, the trigger to the second delay line may be selected from an external source or from an output of the array.

The delay line outputs may be applied to the array directly or, alternatively, may be preprocessed through array driving circuitry. The array driving circuitry preferably comprises a 2-input AND gate, one of the inputs of which is a non-inverting input connected to a first one of the macrocell outputs. The other AND gate input is an inverting input which is connected programmably to a second one of the macrocell outputs. Accordingly, if the second input is programmed to connect to the second macrocell output, then the AND gate output will be a precisely defined window pulse. If the second input is so programmed and the first macrocell output is programmed within the connection array to $V_{cc}$ (logic high or 1), then the output of the AND gate is an inverted version of the signal on the second macrocell output. And if the second input of the AND gate is disconnected from the second macrocell output, then the first macrocell output effectively drives the array directly.

BRIEF DESCRIPTION OF THE DRAWINGS

The invention will be described with respect to particular embodiments thereof, and reference will be made to the drawings, in which.

DETAILED DESCRIPTION OF THE DRAWINGS

Figure 1:
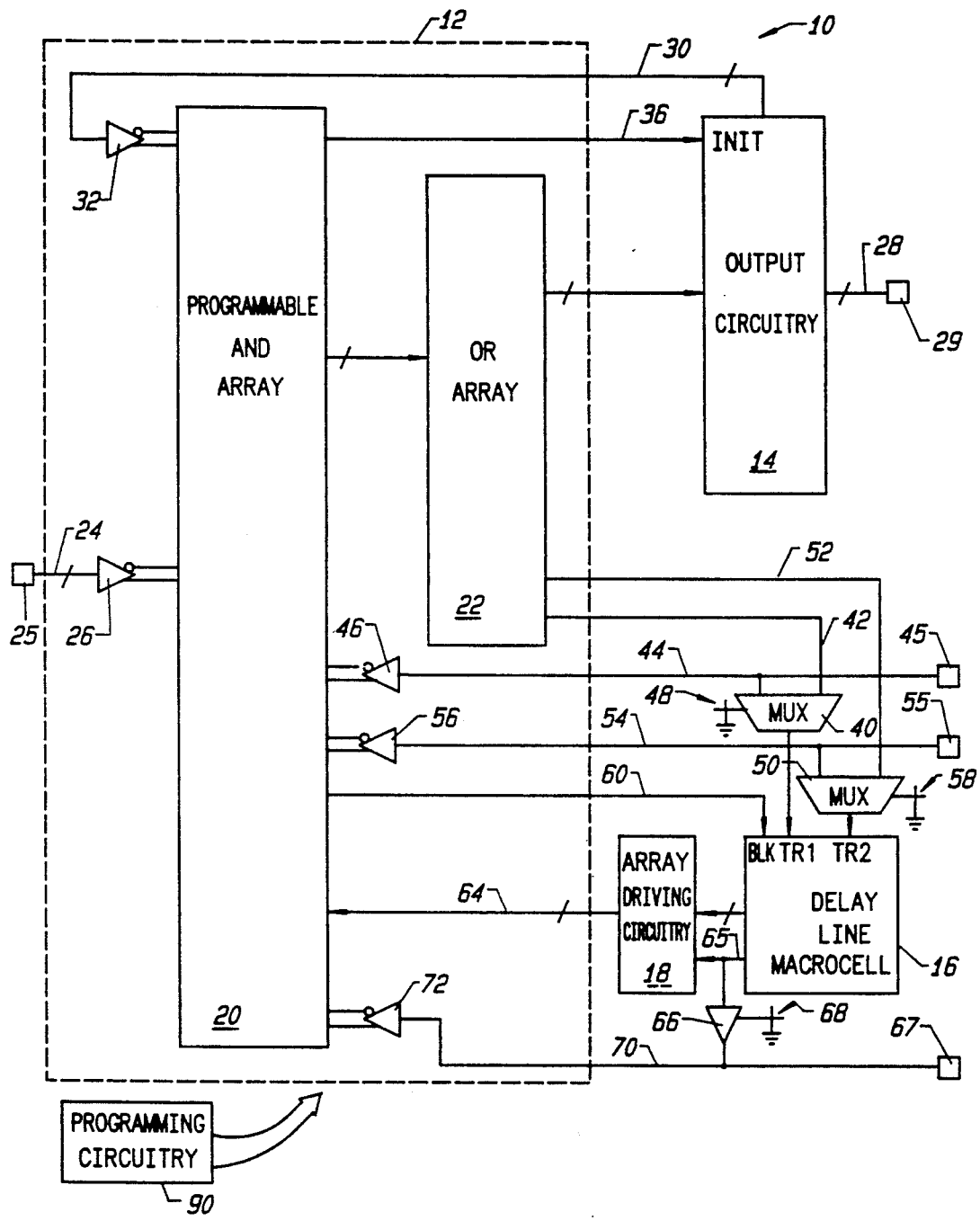
FIG. 1 is a block diagram of a delay line programmable logic device according to the invention.

Shown in FIG. 1 is a block diagram of apparatus according to the invention. It is fabricated on a single chip 10, and comprises a programmable combinatorial logic array 12, output circuitry 14, a delay line macrocell 16, and array driving circuitry 18. The combinatorial array 12 includes a programmable AND array 20 followed by a fixed OR array 22, but the OR array 22 can instead be made programmable. It is well known in the art that though a programmable combinatorial logic array may be described at an architectural or logic level as an AND/OR array, the actual implementation at the transistor level may be NAND/NAND, NOR/NOR, or some other related combination. A programmable combinatorial logic array also may or may not include complementary drivers on its inputs.

A plurality of input lines 24 to the combinatorial array 12 connect to package leads 25, and pass through a respective plurality of complementary drivers 26 before being provided to the AND array 20. Other inputs to the AND array are described below. The OR array 22 has a plurality of outputs which feed the output circuitry 14, outputs of which are connected over lines 28 to package leads 29. The output circuitry 14 also generates a plurality of feedback signals over lines 30, which feed back to the AND array 20 via respective complementary drivers 32. Another output 36 of the combinatorial array 12, this output taken directly from the AND array 20, is provided to an INIT input of the output circuitry 14 and performs a function described below.

The delay line macrocell 16 has three inputs and a plurality of outputs. The TR1 input of delay line macrocell 16 is connected to the output of a 2:1 multiplexer 40, one input 42 of which is connected to an output of OR array 22. The other input of multiplexer 40 is connected over a line 44 to a package pin 45, which is also connected via a complementary driver 46 to inputs of the AND array 20. The selection made by multiplexer 40 is controlled by a programmable fuse 48.

Input TR2 to delay line macrocell 16 is connected to the output of another 2:1 multiplexer 50, one input 52 of which is connected to another output of OR array 22. The other input of multiplexer 50 is connected over a line 54 to a package lead 55, which is also connected through a complementary driver 56 to inputs of the AND array 20. The selection made by multiplexer 50 is controlled by a programmable fuse 58. All programmable fuses in the embodiment of FIG. 1 are in fact EECMOS floating gate cells, but any other technology may be used instead, including but not limited to, fuse, anti-fuse, other floating gate technology, mask or even volatile technology such as RAM and latches. For convenience, all these technologies are referred to herein as "fuses." Further, though various selections outside the combinatorial array 12 are shown as being fuse programmable, many of them can instead be selected by an output of the array 12. The programmable elements on the device 10 are programmed through the use of conventional programming circuitry 90.

A BLK input to delay line macrocell 16 is connected to an array output 60, deriving directly from the AND array 20. (Note that the BLK input can instead come from the output of an OR gate). The function of the BLK input is described below.

The outputs of delay line macrocell 16 are connected to inputs of array driving circuitry 18, the outputs of which are connected over lines 64 to inputs of the AND array 20. One of the outputs, 65, of delay line macrocell 16 is also connected through a three-state buffer 66 to a bi-directional package pin 67 which is also connected over a line 70 and through a complementary driver 72 to inputs of the AND array 20. Programmable fuse 68 controls the output enable of three-state buffer 66. If the buffer 66 is enabled, then package lead 67 directly outputs the signal on delay line macrocell output 65. The signal is also fed back into the AND array 20 via driver 72. If the buffer 66 is disabled, then the package lead 67 becomes another input to the AND array 20 via driver 72.

Combinatorial array 12 is shown in FIG. 1 as a programmable AND array followed by a fixed OR array, with some complementary and some non-complementary inputs to the AND array. However, other fuse- or mask-programmable logic structures would also suffice. In order to minimize clock skew in the AND/OR array context, it is desirable to minimize the number of product terms used in each sum term. It is also desirable that the number of product terms provided to each sum term be as consistent as possible between product terms.

In operation, the multiplexer 40 selects a trigger signal either directly from the package lead 45 or from array output 42 to apply to the first trigger input (TR1) of delay line macrocell 16. Though the selection is here shown fuse-programmable, the selection could instead be responsive to an output of the combinatorial array 12. The delay line macrocell 16 contains a plurality of sequentially coupled active delay elements, taps from which are coupled to outputs of the delay line macrocell 16. A preferred embodiment for the delay line macrocell 16 is described below. The outputs of delay line macrocell 16 are waveforms that replicate the signal on the TR1 input after respective known delays. As described in more detail below, delay line macrocell 16 can also include a second independent delay line whose taps can also be coupled to outputs of delay line macrocell 16. TR2 is the trigger input for the second delay line.

The outputs of delay line macrocell 16 pass through optional array driving circuitry 18 before being provided on lines 64 to inputs of the combinatorial array 12. Various embodiments for the array driving circuitry 18 are described below, but essentially, the array driving circuitry 18 provides a certain amount of preprocessing of the delayed signals from the delay line macrocell 16 in order to improve their usefulness in the array 12.

One of the outputs 65 of delay line macrocell 16 can be routed directly to a package lead via three-state buffer 66, in order to provide a direct output from the delay line macrocell 16. This output has extremely small skew since it passes through a minimum amount of logic before being provided to the lead, and is useful for extremely time-sensitive edges. The direct output is also useful for cascading delay line PLDs together. Polarity selection means, such as an XOR gate, can be added in this output path if desired, at the risk of some additional skew.

The output circuitry 14 preferably includes a plurality of edge-triggered devices, the outputs of which are "asserted" when an effective edge arrives from one output of the combinatorial array 12 and "negated" when an effective edge of a different output of the combinatorial array 12 arrives. In this way, the timing of both the assertion and negation of each output signal on lines 28 can be controlled by the logic in the combinatorial array 12. If the timing of the negation of a signal is not important, then a combinatorial path may be included in the output circuitry 14 for providing a combinatorial array output directly to one of the output leads on one of the lines 28.

The output circuitry 14 also generates signals on line 30 which are fed back to the combinatorial array. The feedback feature permits the assertion or negation of an output signal to be dependent upon when the output signal actually was negated or asserted at some point in the past. The feedback feature also permits the array to alter the timing of trigger signals applied to the delay line macrocell 16, and permits the array to lengthen the effective delay upon certain conditions, and qualify whether and when to trigger the delay line macrocell again.

Output Circuitry

Figure 2:
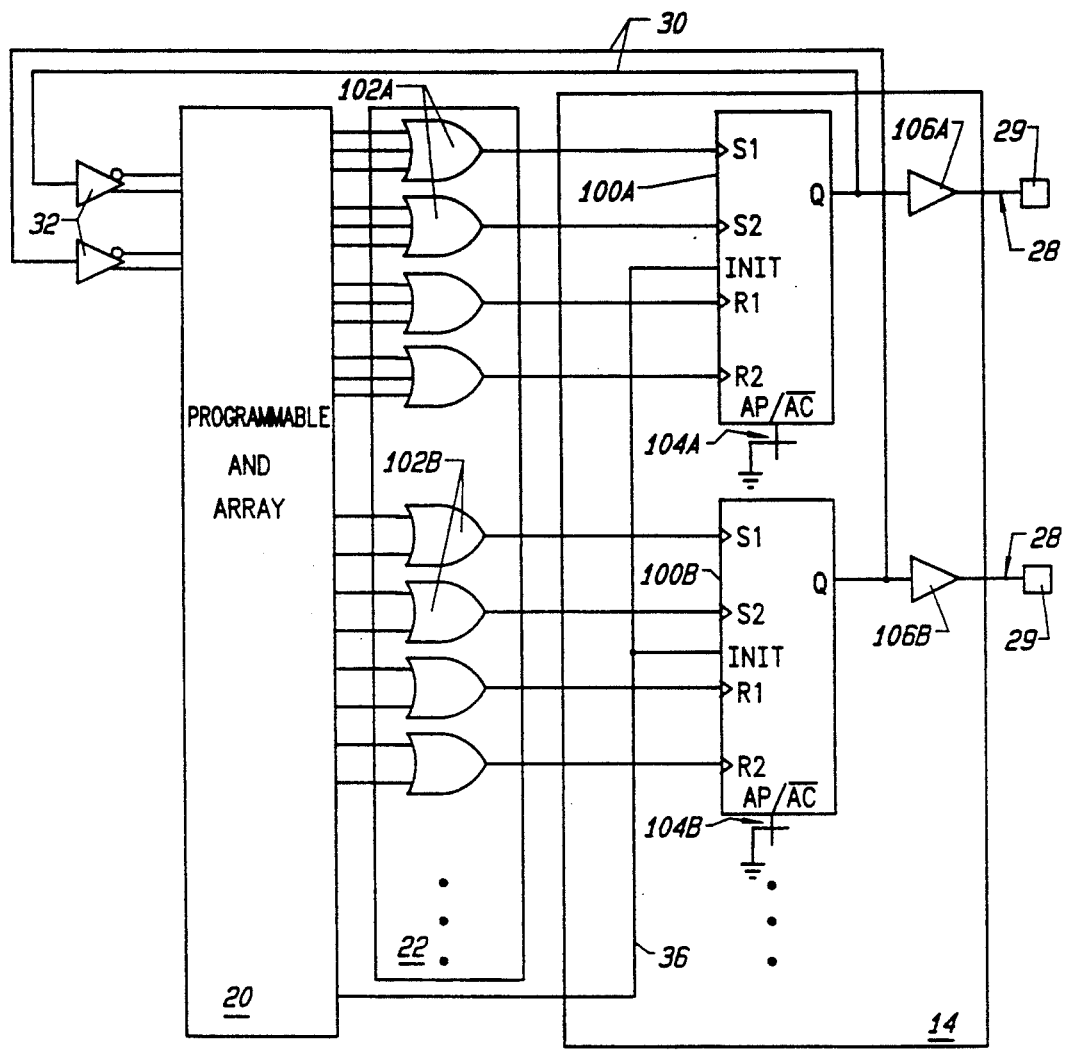
FIG. 2 is a block diagram including a detail of the output circuitry of FIG. 1.

In FIG. 2 there is shown a detail of output circuitry 14, together with a portion of the combinatorial array 12. Output circuitry 14 includes a plurality of edge-triggered set/reset flip flops 100a and 100b, each with two edge-triggered set inputs (S1 and S2) and two edge-triggered reset inputs (R1 and R2) and an output (Q). The edge-triggered inputs to set/reset flip flop 100a are each connected to the output of a respective OR gate 102a in the OR array 22, and the edge-triggered inputs to set/reset flip flop 100b are connected to the outputs of respective OR gates 102b in the OR array 22. OR gates 102a sum together three product terms each, whereas OR gates 102b sum together two product terms each. The edge-triggered inputs of others of the set/reset flip flops 100a and 100b, as well as others not shown in FIG. 2, are also connected to the outputs of an assortment of 2- and 3-input OR gates (not shown) in OR array 22.

Each of the set/reset flip flops 100a and 100b also has an INIT input, and all of the INIT inputs are commonly connected to the product term output 36 of the AND array 20. (Note that INIT input can also come from an OR gate output.) When the product term 36 is activated, each of the flip flops 100a and 100b is asynchronously initialized to the value specified on its respective AP/$\overline{AC}$ input. The AP/0A0C input is determined separately for each of the flip flops 100a and 100b by a respective fuse 104. The Q output of each of the flip flops 100a and 100b is connected through a respective driver 106a and 106b to respective package output leads 29. The Q outputs are also fed back over lines 30 and through complementary drivers 32 into inputs of the AND array 20. Others of the flip flops 100 not shown in FIG. 2 omit the feedback signal. No $\overline{Q}$ is needed for the flip flops 100, since if an active low output is desired, the user need only interchange the product term formulas for the set inputs of the set/reset flip flops with the product term formulas for the reset inputs of the flip flops and program the AP/$\overline{AC}$ fuse appropriately. It should be noted that other prior-art features can also be added to the output circuitry 14. For example, the drivers 106a and 106b can be made three-state, the enable through which can be controlled by a fuse, and a feedback multiplexer can be placed in the feedback paths 30 to select either the Q output of a flip flop or the signal on the pin 29 for feeding back to the array.

Figure 3:
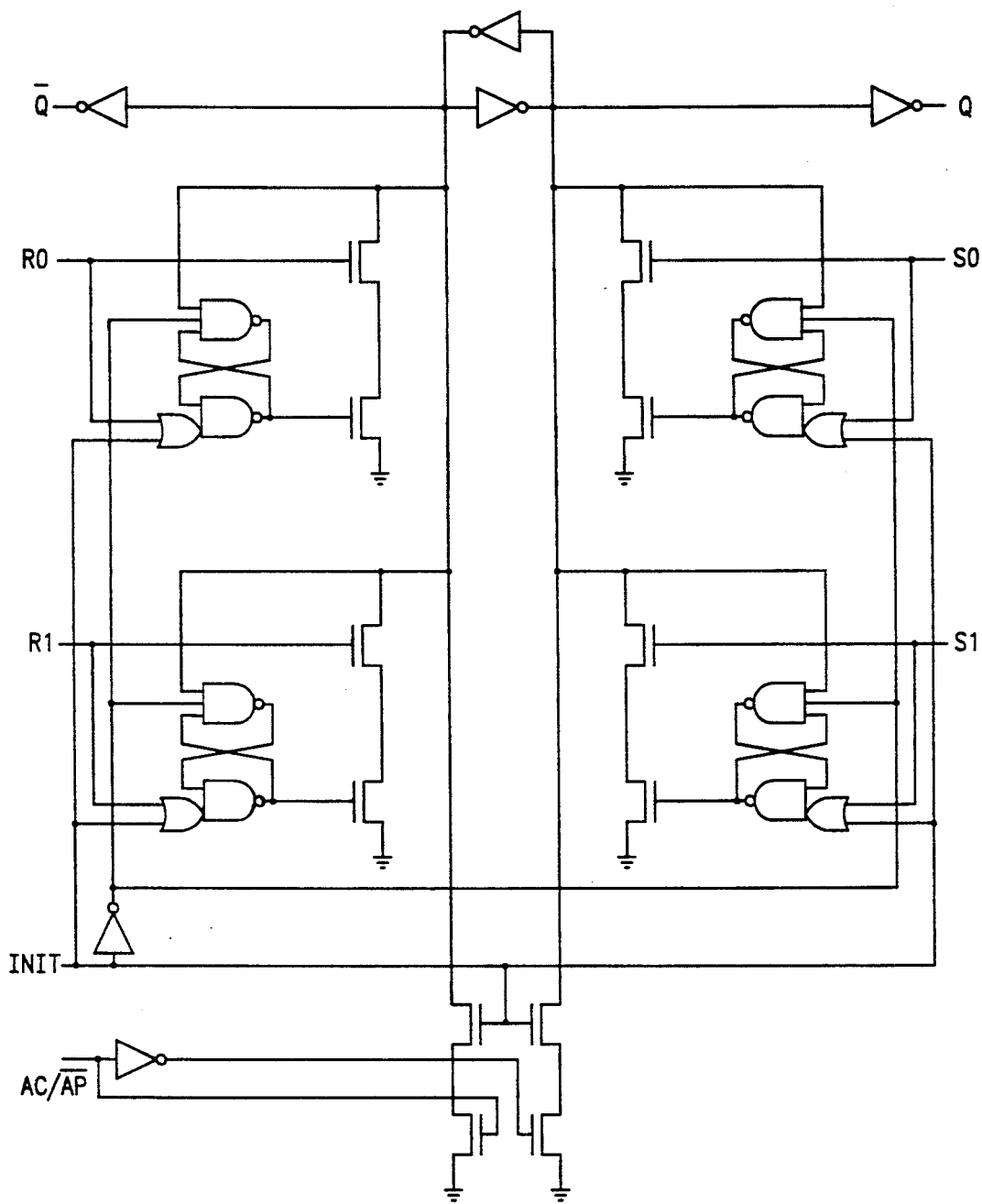
FIG. 3 is a logic-level schematic of a dual-set, dual-reset, edge-triggered set/reset flip flop suitable for use in the circuit of FIG. 2.

Each of the set/reset flip flops is designed so as to minimize skew between the various edge-triggered inputs. That is, the time delay from an edge on any of the four edge-triggering inputs to the Q output is virtually equal for any of the edge-triggering inputs. In this way falling edges on the Q output can be timed just as precisely by the circuit of FIG. 1 as rising edges. The circuit is also designed to have a small settling time in order to avoid any uncertainty which may arise when two triggering edges occur within a short time of each other. Further, the circuit is designed such that a rising edge on either set input while the Q output is low will cause a rising edge on the Q output even if the other set input is still high from a previous rising edge. Similarly, a rising edge on either reset input while the Q output is high will cause a falling edge on the Q output even if the other reset input is still high from a previous rising edge. A dual edge-triggered, set/reset flip flop which satisfies the above criteria is shown in FIG. 3. The output drivers 106a and 106b, in order to minimize skew between rising and falling edges, should be balanced such that the rise time from the minimum output voltage to the threshold voltage is equal to the fall time from the maximum output voltage down to the threshold voltage. Also, since the triggers on the edge-triggered output flip flops are only rising-edge sensitive, speed should be emphasized in the combinatorial array 12 for rising edges rather than being designed for a compromise between rising and falling edges. The combinatorial array 12 should also be as fast as possible to avoid array-related skews. In general, the faster the device is, the less skew it will have.

Figure 4:
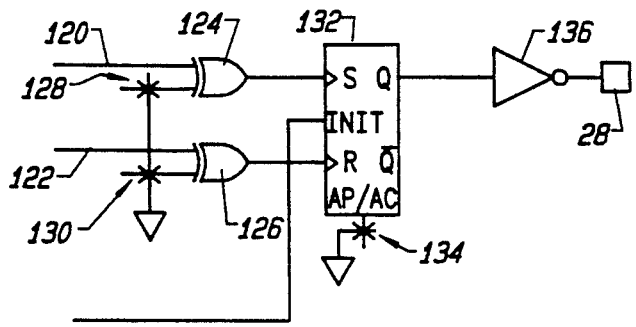
FIGS. 4 and 5 are block diagrams of portions of alternative output circuitry embodiments.

A large number of other possibilities exist for the output circuitry 14. FIG. 4 shows one option, in which two outputs 120 and 122 of the combinatorial array are first selectably inverted by respective XOR gates 124 and 126 controlled by respective fuses 128 and 130, before being provided to respectively the set and reset inputs of a single-set/single-reset edge-triggered flip flop 132. An INIT input is provided from the combinatorial array 12, and a fuse 134 is coupled to an AP/$\overline{AC}$ input of the flip flop 132. The fuse 134 selects whether the INIT input operates as an asynohronous preset or asynchronous clear of the Q output of the flip flop 132. The Q output of the flip flop 132 is provided through a driver 136 to a package lead 28.

The inclusion of XOR gates 124 and 126 permits the user to select either rising or falling edge triggering for each edge-triggering input of the set/reset flip flop. On the other hand, it also adds an additional layer of logic between the delay line outputs and the edge triggering flip flop inputs, therefore increasing the risk of skew. Polarity control on the combinatorial AND/OR array outputs also is useful for minimizing the number of product terms required for the trigger condition, so that by using DeMorgan's theorem, more complex logic functions can be implemented with a limited number of product terms.

Figure 5:
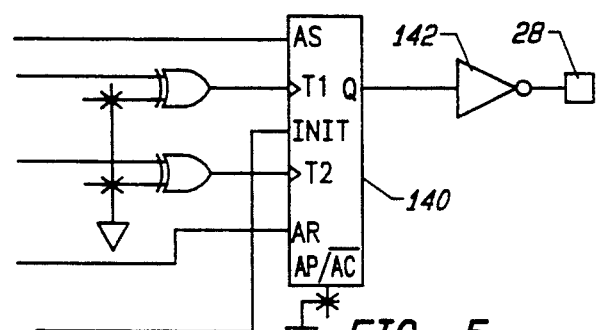

FIG. 5 shows another arrangement for output circuitry 14, in which 2T edge-triggered flip flops 140 are substituted for the dual or single edge-triggered, set/reset flip flops of FIGS. 3 and 4. In a 2T edge-triggered flip flop, a rising edge on either trigger input causes the Q output to toggle, regardless of the state of the other T input. Like the arrangement in FIG. 4, fuse-programmable XOR gates are provided between the array outputs and the edge-triggered inputs of the flip flop 140, an INIT input is connected to a combinatorial array output, a fuse-programmable AP/$\overline{AC}$ input is provided, and the Q output is coupled through a driver 142 to a package lead 28. In addition, AS and AR inputs to the flip flop 140 are connected to respective outputs of the combinatorial array for asynchronously setting or resetting the Q output. 2T edge-triggered flip flops are useful for creating multiple output pulses, but generally require the AS and AR inputs in order to hold the state of the flip flop to avoid unwanted toggling, or to force assertion or negation regardless of the prior state.

Note that output circuitry 14 can contain two or more different types of output flip flops. If so, it is desirable that they all be variations of a single basic circuit design in order to minimize skews from one output to another. The output circuitry 14 can also contain other types of registers, such as D flip flops and latches.

Delay Line Macrocell

Figure 6:
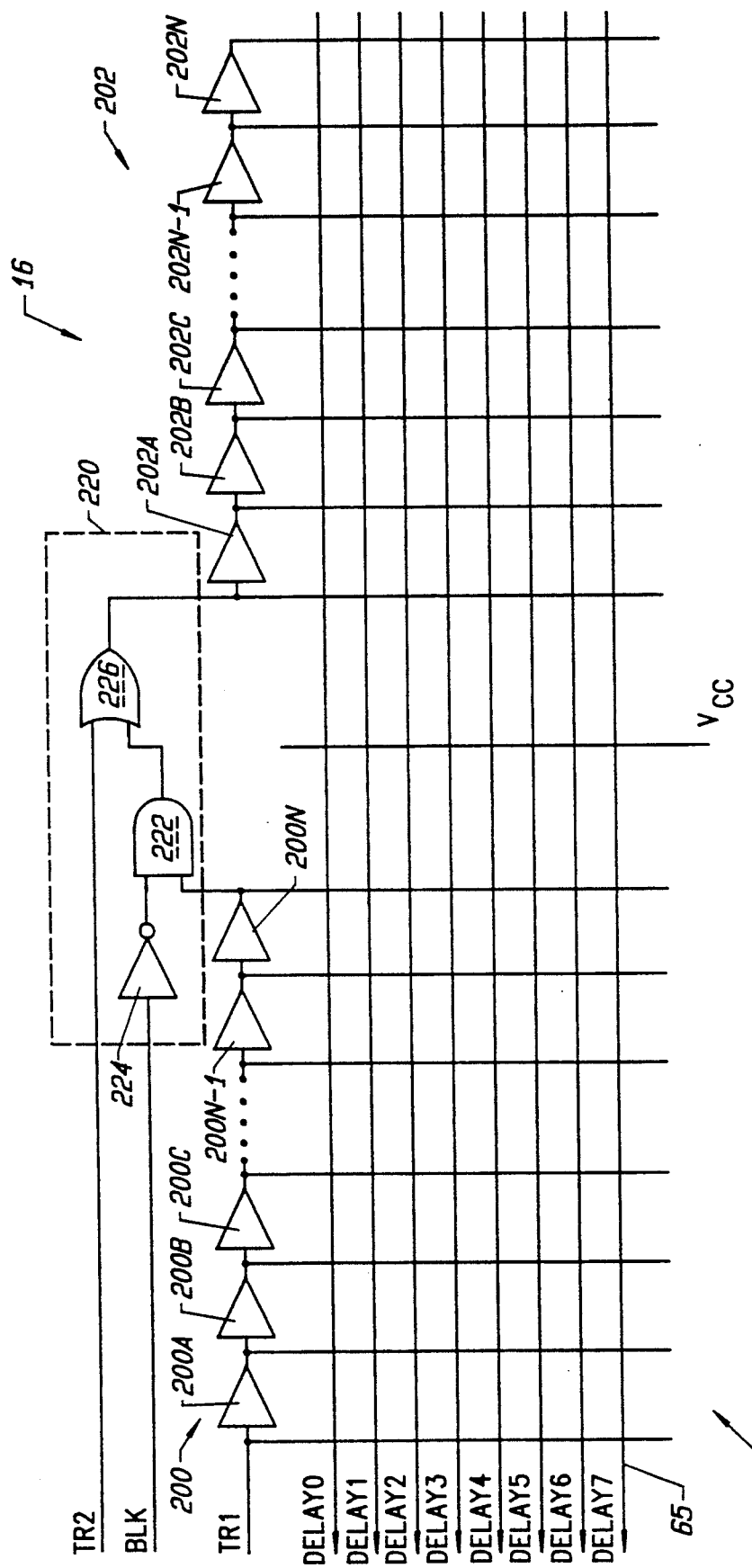
FIG. 6 is a logic-level diagram of the delay line macrocell of FIG. 1.

FIG. 6 shows a detail of the delay line macrocell 16 (FIG. 1). It comprises two strings 200 and 202 of serially coupled delay elements 200a–200n and 202a–202n, respectively. Each string contains 30 of the delay elements, and each delay element represents a highly accurate compensated 5 nanosecond time delay.

Since most applications do not require more than a few selected delays, and since providing a large number of delay taps to the main combinatorial array 12 could unnecessarily increase the size of the array, the delay line macrocell 16 further includes a connection array 210 which can programmably connect any of the taps from either of the two delay line strings 200 and 202 to any of eight delay line macrocell outputs DELAY0–DELAY7. Other numbers of outputs, for example 16, may also be provided. Taps are taken from the output of each delay element in each of the two strings 200 and 202, as well as from the input of the first delay element 200a and 202a in each of the strings. Having the trigger inputs of the two delay lines available as a tap is useful for providing a reference edge indicating when a trigger edge is starting down a delay line. The appearance of edges on subsequent delay line taps will then be precisely referenced to the appearance of the edge on the delay line input. Each of the delay line outputs DELAY0–DELAY7 can also be connected in the connection array 210 to $V_{cc}$. This feature is useful for some of the alternatives for array driving circuitry 18, described below.

In the connection array 210, each tap from the delay lines 200 and 202 can be coupled to only one of the delay line outputs DELAY0–DELAY7, and each of the delay line outputs DELAY0–DELAY7 can be coupled to only one signal source (e.g., only one of the delay line taps or $V_{cc}$). In an alternative embodiment, more than one delay line tap can be programmably coupled to any given one of the delay line outputs. In such a situation, the selected delay line taps should be logically ORed to produce the delay line output signal. More than one delay line output can be programmably coupled to a single signal source as well in a different embodiment, but this flexibility is not needed inside the macrocell if equivalent flexibility is provided outside the macrocell.

In addition to being provided to the connection array 210, the output of delay element 200n in string 200 is also coupled through cascading logic 220 to provide the input signal for the second string 202. In cascading logic 220, the output of delay element 200n is connected to one input of a two-input AND gate 222, the other input of which is connected to the output of an inverter 224. The input of inverter 224 is connected to the BLK input (FIG. 1) of delay line macrocell 16. The output of AND gate 222 is connected to one input of a two-input OR gate 226, the other input of which is connected to the TR2 input (FIG. 1) of the delay line macrocell 16. The output of OR gate 226 is the output of cascading logic 220, and is connected to the input of delay element 202a.

In operation, if the BLK input to delay line macrocell 16 is high, then the signal output of delay element 200n is blocked and not provided to the input of delay element 202a. Instead, the signal from the TR2 input of delay line macrocell 16 is coupled through OR gate 226 and provided to the input of delay element 202a. On the other hand, if BLK is low, then the output of the first delay line 200 is coupled through AND gate 222 and OR gate 226 to the input of the second delay line 202. This effectively cascades the two delay lines together, thereby extending the total delay available in delay line macrocell 16. A signal from the TR2 input of delay line macrocell 16 will also be coupled through OR gate 226 and will also start a signal down the second delay line 202.

The cascading logic 220 shown in FIG. 6 is one example of cascading logic for coupling two delay lines together, and many other designs are possible. For example, another possible implementation of cascading logic 220 is as a simple multiplexer in which an external select input selects whether the input to the second delay line 202 will come from the output of the first delay line 200 or from the TR2 input of the delay line macrocell 16. The embodiment shown for cascading logic 220 in FIG. 6 is preferred, however, since while allowing cascading of the two delays lines, it can still potentially accept triggering pulses from another source (TR2).

Though delay line macrocell 16 shown in FIG. 6 includes two delay lines optionally cascaded together, a different embodiment may include only one delay line, or may include more than two. In order to reduce risks associated with any asymmetry, all of the tap delays should be equal and the number of delay elements in each of the delay lines in the delay line macrocell 16 should be equal. However, in a different embodiment, different tap delays or different numbers of delay elements may be provided.

The delay line elements 200a-200n and 202a-202n should be individual active delay elements so as to permit the user to start a new signal down the line before an earlier signal reaches the end of the line. This is a technique useful for pipelined asynchronous control schemes. Also, the rise and fall time for the output of each delay element should be the same, in order to prevent shrinkage or expansion of pulses as they are transmitted down the delay. Further, the delay lines should be able to accept short triggers, for high and low duration, in order to facilitate tighter pipeline timing. Finally, the time delay of the delay elements should not change as a result of either temperature variations or chip-to-chip process variations.

Figure 7:
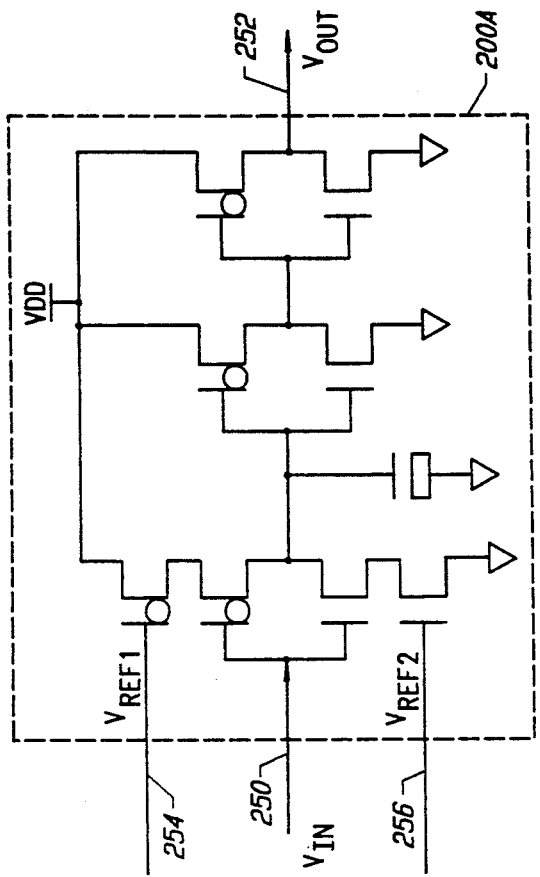
FIGS. 7 and 8 are transistor level schematic diagrams of portions of the delay line macrocell of FIG. 6.
Figure 8:
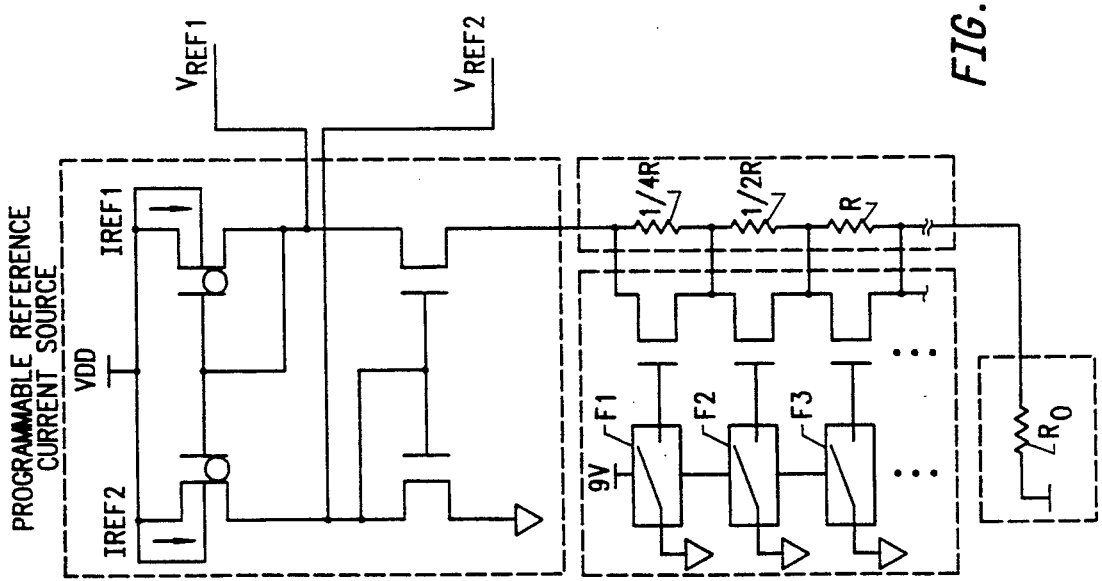

The apparatus shown in FIGS. 7 and 8 satisfy the above criteria. Each of the delay elements 200b-200n and 202b-202n are identical and are constructed according to the circuit of FIG. 7. The voltage references 254 and 256 for all of the delay elements 200 and 202 are generated by a programmable reference current source as shown in FIG. 8. The circuits of FIGS. 7 and 8 are both described in detail in the related application and will not be further described here. However, it should be noted that the programmable reference current source of FIG. 8 is inherently temperature compensating, and each chip can be individually compensated for process variations by programming the electrically erasable fuses F1, F2 and F3. Though any of the other fuses in the device of FIG. 1 can be made mask programmable, the fuses F1, F2 and F3 would not be made mask programmable if they are to be used to compensate for process variations between different chips.

The entire delay line macrocell 16 should preferably be laid out in a very regular manner, tightly coupled to avoid skews. The macrocell should be separated from the remainder of the circuit for noise reduction and it may be desirable further to include a noise guard around the macrocell and to incorporate large ground and $V_{cc}$ buses.

The delay line macrocell 16 shown in FIG. 6 is only one example of a delay line macrocell usable with the invention. In another embodiment, only one delay line of 30 delay elements is included, and only a single trigger input is provided. A KILL input (shown in FIG. 6) may also be provided to force any signal propagating down the delay line to a known voltage (such as zero). If provided, the KILL input should be connected to one of the outputs of the combinatorial array 12. The KILL capability would allow the user to speed up a system in some applications, and is most useful in delay line implementations which do not permit more than one pulse to be propagating down the line at the same time. The KILL feature may also be implemented in such a way that it simply blocks further propagation of a signal beyond a programmably selectable tap in the delay line. Returning to FIG. 1, as mentioned above, one of the possible inputs to the TR1 or TR2 inputs to delay line macrocell 16 comes from an output of the combinatorial array 12. If the combinatorial array 12 is organized as a programmable AND and a fixed OR array, it is desirable to derive these trigger input signals from respective sum terms. One (secondary) product term for the sum should be programmed to mask any glitches that might appear on another (primary) product term, thereby avoiding false triggering of the delay line macrocell 16 by the primary product term. Additional product terms are also useful if it is desired to be able to start pulses down a delay line on more than one condition.

Also referring to FIG. 1, as explained above, one of the outputs 65 of delay line macrocell 16, in addition to being coupled to the array driving circuitry 18, is also couplable through a three-state buffer 66 to a package lead. Such a direct output tap is usually not necessary, since all the logic to which it would otherwise be connected should now be programmable into the combinatorial array 12. The direct output tap is useful, however, for testing and for cascadability of multiple delay line PLDs.

Array Driving Circuitry

Figure 9A:
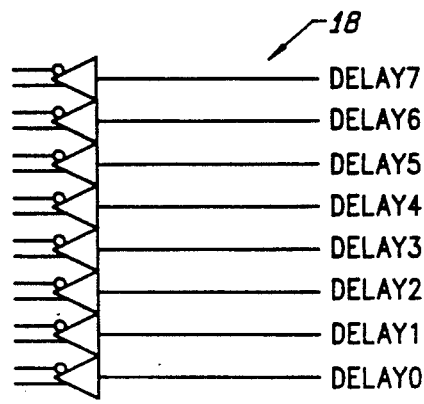
FIGS. 9a-9e are alternative embodiments for the array driving circuitry of FIG. 1.

One option for array driving circuitry 18 is to have a simple, active-high driver coupling each delay line macrocell output to a respective input of the combinatorial array 12. This option minimizes skews, but leaves all signal processing to the combinatorial array 12. FIGS. 9a-9e depict some other possible embodiments for the array driving circuitry 18. In FIG. 9a, the array driving circuitry consists of a complementary driver coupling each delay line macrocell output to respective pairs of complementary inputs to the combinatorial array 12.

Figure 9B:
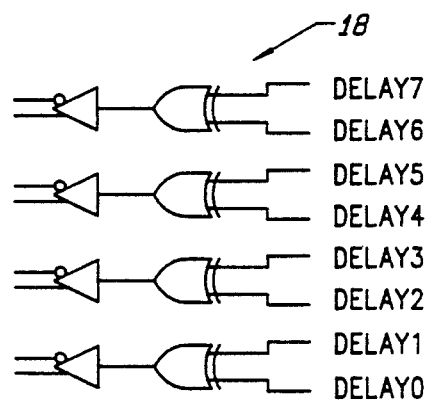

Another option, shown in FIG. 9b, comprises a plurality of 2-input XOR gates, the inputs of which are coupled to respective pairs of the delay line macrocell outputs. The outputs of each of the XOR gates are then coupled through a complementary driver to a respective pair of inputs to the combinatorial array 12. The arrangement of FIG. 9b is useful for generating pulses having accurate widths. In particular, the user would program the connection array 210 such that two of the delay line macrocell outputs (e.g., DELAY0 and DE- LAY1) connect to selected taps of one of the delay lines. As an edge propagates down the delay line, then, one of the delay line macrocell outputs will switch before the other. The XOR gate in array driving circuitry 18 will then output a logic 1 for only the time period between the two selected taps. The user must be careful, however, since a pulse will appear on the output of the XOR gate also in response to the trailing edge of a pulse propagating down the delay line.

Figure 9E:
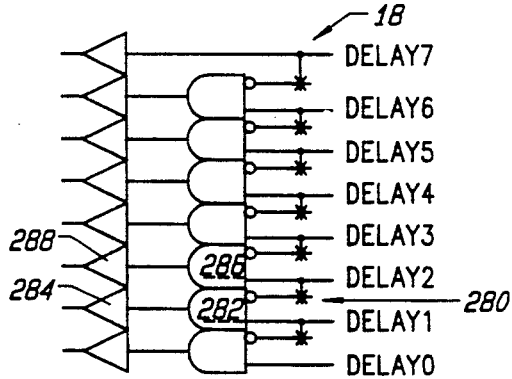
Figure 9D:
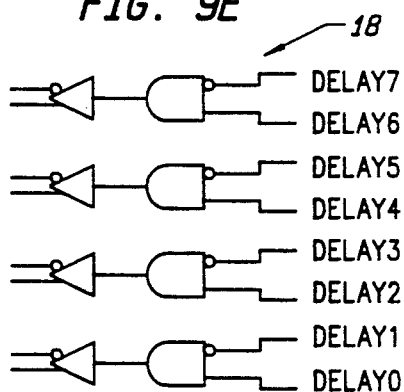

The embodiment shown in FIG. 9d comprises a plurality of 2-input AND gates, one input of which is inverting and the other input of which is non-inverting, and the outputs of which are coupled via respective complementary drivers into the combinatorial array 12. The inputs to the AND gates are connected to respective pairs of outputs of the delay line macrocell 16. Like the arrangement of FIG. 9b, this arrangement is also useful for generating pulses having an accurate duration. This arrangement, however, generates such pulses only on one edge of a pulse propagating down the delay line.

Figure 9C:
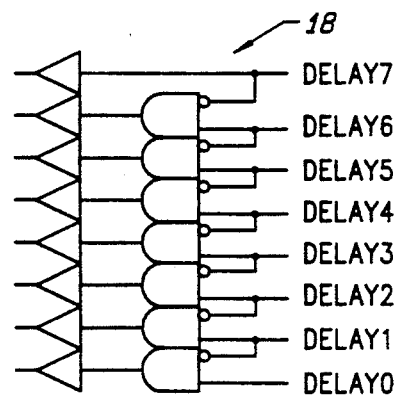

The embodiment shown in FIG. 9c comprises a plurality of AND gates each having an inverting and a non-inverting input, the output of each of the AND gates driving the combinatorial array through a respective non-inverting buffer. Each of the delay line macrocell outputs, except for DELAY0 and DELAY7, is connected both to the non-inverting input of one AND gate and the inverting input of another AND gate, such that each of the AND gates has its non-inverting input connected to one delay line macrocell output and its inverting input connected to another. The DELAY0 output of delay line macrocell 16 is connected only to the non-inverting input of the AND gate whose inverting input is connected to the DELAY1 output, and the DELAY7 output of the delay line macrocell 16 is connected only to the inverting input of the AND gate whose non-inverting input is connected to the DELAY6 output. The DELAY7 output of the delay line macrocell 16 is also coupled through its own dedicated, non-inverting buffer to an input of the combinatorial array. The arrangement of FIG. 9c is essentially the same as that of FIG. 9d, with the addition of some functionality provided by three additional AND gates. The outputs of the three added AND gates are provided as additional inputs to the combinatorial array 12.

FIG. 9e shows yet another embodiment for array driving circuitry 18. It is identical to the arrangement of FIG. 9c, except that the connection between each of the delay line macrocell outputs and an inverting input of an AND gate is programmable. In particular, if the fuse is disconnected, then a logic 0 is applied to the inverting input of the AND gate, effectively causing it to pass the non-inverting input signal directly through. Thus, if the user disconnects one of the fuses, say, fuse 280, then AND gate 282 and buffer 284 will pass the DELAY1 output signal from delay line macrocell 16 directly into the combinatorial array 12. If the fuse 280 is left connected, then the AND gate 282 can be used to generate a pulse from the rising edge of DELAY1 to the rising edge of DELAY2. Finally, by leaving fuse 280 intact (connected), and by programming the connection array 210 (FIG. 6) such that the DELAY1 output of delay line macrocell 16 is connected to $V_{cc}$, AND gate 282 and buffer 284 will drive the combinatorial array with the logical inverse of the signal on the DELAY2 output of delay line macrocell 16. The arrangement of FIG. 9e is the most flexible of the above-described arrangements for array driving circuitry 18, since it permits the user to program it to perform many of the functions that can be performed by the other embodiments. A trade-off exists in the form of additional risk of skew, especially for triggers sensitive to the falling edge of the delay signal. If the output circuitry 14 contains only rising edge triggered flip flops, however, such as those shown in FIG. 2, then falling edge skew is usually not a problem.

The invention has been described with respect to particular embodiments thereof, and it will be understood that numerous variations are possible without departing from the scope of the invention. For example, though delay lines having serially coupled individual delay elements are preferred, other types of delay lines can be used if certain advantages of the invention are unimportant. These and other variations are intended to be within the scope of the invention.

What is claimed is:

1. A programmable logic device comprising:
   a programmable logic circuit having circuit inputs and circuit outputs;
   a delay line macrocell having a delay line input, a plurality of delay line taps, a plurality of delay line outputs and connection array means for coupling each of said delay line outputs to a selected one of said delay line taps; and
   circuit driving means for coupling said delay line outputs to a subset of said circuit inputs.

2. Apparatus according to claim 1, wherein said programmable logic circuit is a programmable combinatorial logic circuit, further comprising a set/reset flip-flop having at least one edge-triggered set input, at least one edge-triggered reset input and an output, each of said inputs of said set/reset flip-flop being coupled to a respective one of said circuit outputs.

3. Apparatus according to claim 2, wherein said set/reset flip-flop has two edge-triggered set inputs and two edge-triggered reset inputs, each of said inputs of said set/reset flip-flop being coupled to a respective one of said circuit outputs, said set/reset flip-flop setting its output if a predetermined edge is received on either of said set inputs while said flip-flop is reset and resetting its output if a predetermined edge is received on either of said reset inputs while said flip-flop is set.

4. Apparatus according to claim 1, further comprising delay line input coupling means for coupling one of said circuit outputs to said delay line input.

5. Apparatus according to claim 4, wherein said delay line input coupling means couples one of said circuit outputs selectably with another signal to said delay line input.

6. Apparatus according to claim 1, further comprising:
   a package lead coupled to one of said circuit inputs; and
   delay line input coupling means for coupling said delay line input selectably to said package lead or to one of said circuit outputs.

7. Apparatus according to claim 1, wherein said delay line macrocell comprises a first plurality of serially coupled first delay elements, each having an input and an output, the input of the first of said first delay elements being coupled to receive said delay line input, and wherein said connection array means couples each of said delay line outputs selectably to at least the output of any one of said first delay elements.

8. Apparatus according to claim 7, wherein said connection array means is further for coupling each of said delay line outputs selectably to said delay line input.

9. Apparatus according to claim 7, wherein said connection array means is further for coupling each of said delay line outputs selectably to a logic 1.

10. Apparatus according to claim 7, wherein said delay line macrocell further comprises a second plurality of serially coupled second delay elements, each having an input and an output, and wherein said connection array means is further for coupling each of said delay line outputs selectably to the output of any one of said second delay elements.

11. Apparatus according to claim 1, wherein said delay line macrocell comprises:
first and second pluralities of serially coupled delay elements, each of said delay elements having an input and an output, the input of the first delay element in said first plurality being coupled to receive said delay line input, the delay line taps comprising outputs of said delay line elements; and
cascading means for coupling the output of the last delay element in said first plurality to the input of the first delay element in said second plurality.

12. Apparatus according to claim 11, wherein said cascading means couples the output of the last delay element in said first plurality selectably with another signal to the input of the first delay element in said second plurality.

13. Apparatus according to claim 11, wherein said delay line macrocell further has a blocking input, and wherein said cascading means blocks the output of the last delay element in said first plurality from reaching the input of the first delay element in said second plurality in response to a signal on said blocking input.

14. Apparatus according to claim 1, wherein said delay line macrocell further comprises:
a kill input; and
means for forcing each of said delay line taps to a predetermined value in response to a signal on said kill input.

15. Apparatus according to claim 14, wherein said kill input is coupled to one of said circuit outputs.

16. Apparatus according to claim 1, further comprising a package lead and programmable means for coupling one of said delay line outputs to said package lead.

17. Apparatus according to claim 1, wherein said circuit driving means comprises means for coupling each of said delay line outputs and, a complement of each of said delay line outputs to respective ones of said circuit inputs.

18. Apparatus according to claim 1, wherein said circuit driving means comprises:
a plurality of logic gates, each having a plurality of inputs and an output, each of said inputs of said logic gates being coupled to a respective one of said delay line outputs; and
means for coupling the outputs of said logic gates to said subset of circuit inputs.

19. Apparatus according to claim 18, wherein said logic gates are XOR gates.

20. Apparatus according to claim 18, wherein each of said logic gates is an AND gate having one inverting and one non-inverting input.

21. Apparatus according to claim 1, wherein said circuit driving means comprises:
a plurality of logic gates, each having a plurality of inputs and an output, each of said delay line outputs being coupled to inputs of at least two of said logic gates; and
means for coupling the outputs of said logic gates to said subset of circuit inputs.

22. Apparatus according to claim 21, wherein each of said logic gates is an AND gate having one inverting and one non-inverting input, and wherein each of said delay line outputs is coupled to the non-inverting input of one of said AND gates and the inverting input of another of said AND gates.

23. Apparatus according to claim 1, wherein said circuit driving means comprises:
a logic gate having at least two inputs and an output, one of said inputs of said logic gate being coupled to one of said delay line outputs, and another of said inputs of said logic gate being coupled programmably to another of said delay line outputs; and
means for coupling the output of said logic gate to one of said subset of circuit inputs.

24. A programmable logic device comprising:
a delay line having a plurality of taps;
an output circuit having an edge-triggered input; and
means for triggering said edge-triggered input as a user-defined combinatorial logic function of said taps.

25. A programmable logic device comprising:
a delay line having a plurality of taps;
a flip flop having at least a first edge-triggered input; and
a programmable combinatorial logic circuit having inputs coupled to said taps and having a first output coupled to said first edge-triggered input.

26. Apparatus according to claim 25, further comprising package leads, one of said leads being coupled as an additional input to said combinatorial logic circuit.

27. Apparatus according to claim 25, wherein said delay line has a trigger input coupled to an additional output of said combinatorial logic circuit.

28. Apparatus according to claim 25, wherein said flip flop is a set/reset flip flop having an edge-triggered set input and an edge-triggered reset input, said first edge triggered input being said edge-triggered set input and said edge-triggered reset input being coupled to a second output of said combinatorial logic circuit.

29. Apparatus according to claim 28, wherein said flip flop further has a second edge triggered set input and a second edge-triggered reset input, said second edge-triggered set input being coupled to a third output of said combinatorial logic circuit and said second edge-triggered reset input being coupled to a fourth output of said combinatorial logic circuit.

30. Apparatus according to claim 25, wherein said flip flop is a toggle flip flop having an edge-triggered toggle input being said first edge-triggered input.

31. Apparatus according to claim 30, wherein said flip flop further has a second edge-triggered toggle input coupled to a second output of said combinatorial logic circuit.

32. Apparatus according to claim 25, wherein said flip flop is a clocked flip flop having a clock input being said first edge-triggered input.

33. Apparatus according to claim 25, wherein said flip flop has an output, further comprising a feedback path from said output of said flip flop to a further input of said combinatorial logic circuit.

34. Apparatus according to claim 33, further comprising package leads, wherein said output of said flip flop is also coupled to one of said package leads.

35. Apparatus according to claim 25, wherein said programmable combinatorial logic circuit comprises:
a connection array having connection array inputs and connection array outputs and means for coupling each of said connection array outputs to a selected one of said connection array inputs, each of said delay line taps being coupled to a respective one of said connection array inputs; and
a further combinatorial logic circuit having inputs coupled to said connection array outputs and having outputs being outputs of said programmable combinatorial logic circuit.

36. Apparatus according to claim 35, wherein said further combinatorial logic circuit comprises:
a programmable logic array including a programmable AND array followed by an OR array, said programmable logic array having AND array inputs and OR array outputs, said OR array outputs being outputs of said programmable combinatorial logic circuit; and
means for coupling to one of said AND array inputs selectably either one of said connection array outputs or one of said connection array outputs gated with another of said connection array outputs.

37. A programmable logic device formed on a single chip, comprising:
a first delay line having an input and a plurality of first taps; and
means on said chip for coupling a signal to said input of said first delay line as a user-defined logic function of said first taps.

38. Apparatus according to claim 37, wherein said means for coupling comprises a programmable combinatorial logic circuit having inputs coupled to said first taps and having an output coupled to said input of said first delay line.

39. Apparatus according to claim 38, further comprising a package lead, wherein said programmable combinatorial logic circuit comprises:
means for generating a first signal which is a user-defined combinatorial logic function of said first taps; and
means for applying to said input of said first delay line selectably said first signal or a signal on said package lead.

40. Apparatus according to claim 37, further comprising a KILL input, wherein said first delay line comprises means for forcing each of said first taps to a predetermined value in response to a signal on said KILL input.

41. Apparatus according to claim 37, wherein said first delay line comprises a plurality of serially coupled active delay elements, said first taps being taken from outputs of said delay elements.

42. Apparatus according to claim 37, further comprising a second delay line having an input and a plurality of second taps, said user-defined logic function being a user-defined logic function of said first and second taps.

43. Apparatus according to claim 42, wherein said user-defined logic function is a user-defined logic function of said first and second taps, the signal on the input of each of said delay lines, and a logic 1.

44. Apparatus according to claim 42, further comprising cascading means for coupling the output of the last of said first taps to said input of said second delay line.

45. Apparatus according to claim 44, further comprising a blocking signal input, wherein said cascading means comprises means for gating said output of the last of said first taps with another signal to provide said input of said second delay line if said blocking signal is inactive, and for coupling said other signal to said input of said second delay line if said blocking signal is active.

46. Apparatus according to claim 37, wherein said means for coupling comprises:
a connection array having inputs coupled to respective ones of said first taps, having outputs and having means for coupling each of said outputs of said connection array to receive one of said first taps;
combinatorial coupling circuitry having inputs coupled to respective ones of said outputs of said connection array and having outputs; and
a programmable array logic circuit including a programmable AND array followed by an OR array, said programmable array logic circuit having inputs coupled to respective ones of said outputs of said combinatorial coupling circuitry and having outputs; and
means for applying one of said outputs of said programmable array logic circuit to said input of said first delay.

47. Apparatus according to claim 46, further comprising:
a plurality of package leads; and
output circuitry having inputs and outputs, said outputs of said output circuitry being coupled to said package leads,
wherein said programmable array logic circuit further has additional inputs coupled to said package leads and additional outputs coupled to said inputs of said output circuitry.

48. A programmable logic device comprising:
a delay line having a plurality of taps;
a programmable logic circuit having a plurality of inputs and a plurality of outputs; and
logic circuit driving means for preprocessing at least a subset of said delay line taps to provide at least a subset of said programmable logic circuit inputs.

49. Apparatus according to claim 48, wherein said logic circuit driving mean comprises first means for gating a first one of said taps with a second one of said taps to provide a first one of said inputs to said programmable logic circuit.

50. Apparatus according to claim 49, wherein said logic circuit driving means further comprises second means for gating a third one of said taps with a fourth one of said taps to provide a second one of said inputs to said programmable logic circuit.

51. Apparatus according to claim 49, wherein said logic circuit driving means further comprises second means for gating said second one of said taps with a third one of said taps to provide a second one of said inputs to said programmable logic circuit.

52. Apparatus according to claim 51, wherein said first means for gating comprises a first AND gate having a non-inverting input, an inverting input, and an output, said output of said first AND gate being coupled to said first one of said inputs to said programmable logic circuit, said non-inverting input of said first AND gate being programmably couplable to said first one of said taps and said inverting input of said first AND gate being programmably couplable to said second one of said taps or to a logic zero, and wherein said second means for gating comprises a second AND gate having a non-inverting input, an inverting input, and a output, said output of said second AND gate being coupled to said second one of said inputs to said programmable logic circuit, said non-inverting input of said second AND gate being programmably couplable to said second one of said taps and said inverting input of said second AND gate being programmably couplable to said third one of said taps or to a logic zero.

53. Apparatus according to claim 49, wherein said first means for gating a first one of said taps with a second one of said taps includes means for programmably selecting said first one of said taps and said second one of said taps from said plurality of delay line taps.

54. Apparatus according to claim 53, wherein said first means for gating further includes means for programmably selecting said first tap and said second tap from an input of said delay line or a logic 1.

55. A programmable logic device comprising:
  a delay line macrocell including first and second strings of serially coupled active delay elements and a programmable connection array having connection array inputs and connection array outputs, said connection array inputs being coupled to receive respectively the output of each of said delay elements, the input of the first delay element in each of said strings, and a logic 1;
  array driving circuitry including a plurality of gates, each of said gates having an inverting input, a non-inverting input, and an output, each of said inputs of said gates being coupled to receive an output of said delay line macrocell, at least one of said outputs of said delay line macrocell being coupled to the inverting input of one of said gates and the non-inverting input of another of said gates;
  a programmable combinatorial logic circuit including a programmable AND array followed by a fixed OR array, said AND array having inputs coupled to receive said outputs of said gates in said array driving circuitry, said programmable combinatorial logic circuit further including AND array outputs from said AND array and OR array outputs from said OR array;
  a plurality of package leads;
  first and second multiplexers each having respective first and second inputs and an output, and each further having a select input, said first input of each of said multiplexers being coupled to receive a respective one of said OR array outputs and said second input of each of said multiplexers being coupled to a respective one of said package leads, said output of said first multiplexer being coupled to the input of said first string of delay elements in said delay line macrocell and said output of said second multiplexer being coupled to the input of said second string of delay elements in said delay line macrocell; and
  output circuitry including a plurality of set/reset flip flops each including two edge-triggered set inputs and two edge-triggered reset inputs and an output, each of said edge-triggered inputs being coupled to receive a respective one of said OR array outputs, the outputs of at least one of said flip flops being coupled to respective package leads, and the outputs of at least one of said flip flops being coupled to respective AND array inputs of said programmable combinatorial logic array.

* * * * *